(12) United States Patent
Blanchard

(10) Patent No.: US 7,224,027 B2
(45) Date of Patent: May 29, 2007

(54) HIGH VOLTAGE POWER MOSFET HAVING A VOLTAGE SUSTAINING REGION THAT INCLUDES DOPED COLUMNS FORMED BY TRENCH ETCHING AND DIFFUSION FROM REGIONS OF OPPOSITELY DOPED POLYSILICON

(75) Inventor: Richard A. Blanchard, Los Altos, CA (US)

(73) Assignee: General Semiconductor, Inc., Melville, NY (US)

( * ) Notice: Subject to any disclaimer, the term of this patent is extended or adjusted under 35 U.S.C. 154(b) by 0 days.

(21) Appl. No.: 10/945,018

(22) Filed: Sep. 20, 2004

(65) Prior Publication Data

US 2005/0042830 A1 Feb. 24, 2005

Related U.S. Application Data

(62) Division of application No. 10/414,949, filed on Apr. 16, 2003, now Pat. No. 6,794,251, which is a division of application No. 10/039,241, filed on Dec. 31, 2001, now Pat. No. 6,576,516.

(51) Int. Cl.
*H01L 29/76* (2006.01)
*H01L 29/94* (2006.01)

(52) U.S. Cl. .................. 257/342; 257/329; 257/341

(58) Field of Classification Search ................ 257/342, 257/329, 341
See application file for complete search history.

(56) References Cited

U.S. PATENT DOCUMENTS

| | | | |
|---|---|---|---|
| 4,140,558 A | 2/1979 | Murphy et al. | 148/175 |
| 4,419,150 A | 12/1983 | Soclof | 148/187 |
| 4,569,701 A * | 2/1986 | Oh | 438/389 |

(Continued)

OTHER PUBLICATIONS

Ming-Kwang Lee, et al., "On The Semi-Insulating Polycystalline Silicon Resistor", *Solid State Electronics*, vol. 27, No. 11, pp. 995-1001, 1984.

(Continued)

*Primary Examiner*—Matthew Smith
*Assistant Examiner*—David Goodwin
(74) *Attorney, Agent, or Firm*—Mayer & Williams PC; Stuart H. Mayer, Esq.; Karin L. Williams, Esq.

(57) ABSTRACT

A method is provided for forming a power semiconductor device. The method begins by providing a substrate of a first or second conductivity type and then forming a voltage sustaining region on the substrate. The voltage sustaining region is formed by depositing an epitaxial layer of a first conductivity type on the substrate and forming at least one trench in the epitaxial layer. A first layer of polysilicon having a second dopant of the second conductivity type is deposited in the trench. The second dopant is diffused to form a doped epitaxial region adjacent to the trench and in the epitaxial layer. A second layer of polysilicon having a first dopant of the first conductivity type is subsequently deposited in the trench. The first and second dopants respectively located in the second and first layers of polysilicon are interdiffused to achieve electrical compensation in the first and second layers of polysilicon. Finally, at least one region of the second conductivity type is formed over the voltage sustaining region to define a junction therebetween.

20 Claims, 5 Drawing Sheets

THE DOPANT DISTRIBUTION OF A HIGH VOLTAGE VERTICAL
DMOS TRANSISTOR WITH A RELATIVELY LOW ON-RESISTANCE

U.S. PATENT DOCUMENTS

| | | | | |
|---|---|---|---|---|
| 4,711,017 | A | 12/1987 | Lammert | 437/20 |
| 4,795,716 | A * | 1/1989 | Yilmaz et al. | 438/209 |
| 4,893,160 | A | 1/1990 | Blanchard | 357/23.4 |
| 5,108,783 | A * | 4/1992 | Tanigawa et al. | 438/359 |
| 5,216,275 | A | 6/1993 | Chen | 257/493 |
| 5,675,173 | A | 10/1997 | Kawai et al. | 257/508 |
| 5,700,712 | A * | 12/1997 | Schwalke | 438/430 |
| 5,744,719 | A * | 4/1998 | Werner | 73/514.32 |
| 5,759,921 | A * | 6/1998 | Rostoker | 438/711 |
| 5,885,878 | A * | 3/1999 | Fujishima et al. | 438/302 |
| 6,174,773 | B1 * | 1/2001 | Fujishima | 438/270 |
| 6,184,555 | B1 * | 2/2001 | Tihanyi et al. | 257/342 |
| 6,188,104 | B1 | 2/2001 | Choi et al. | 257/330 |
| 6,215,149 | B1 | 4/2001 | Lee et al. | 257/328 |
| 6,274,904 | B1 | 8/2001 | Tihanyi | 257/329 |
| 6,452,230 | B1 * | 9/2002 | Boden, Jr. | 257/341 |
| 6,455,379 | B2 | 9/2002 | Brush et al. | 438/270 |
| 6,465,304 | B1 | 10/2002 | Blanchard et al. | 438/268 |
| 6,472,678 | B1 | 10/2002 | Hshieh et al. | 257/3 |
| 6,472,708 | B1 | 10/2002 | Hshieh et al. | 257/331 |
| 6,479,352 | B2 | 11/2002 | Blanchard | 438/268 |
| 6,495,884 | B2 | 12/2002 | Harada et al. | 257/333 |
| 6,534,836 | B1 * | 3/2003 | Osanai | 257/401 |
| 6,549,477 | B1 | 4/2003 | Bautista, Jr. et al. | 438/268 |
| 6,566,201 | B1 | 5/2003 | Blanchard | 438/268 |
| 6,608,350 | B2 * | 8/2003 | Kinzer et al. | 257/341 |
| 6,630,698 | B1 * | 10/2003 | Deboy et al. | 257/285 |
| 6,656,797 | B2 | 12/2003 | Blanchard | 438/268 |
| 6,750,104 | B2 | 6/2004 | Blanchard et al. | 438/268 |
| 2001/0026977 | A1 | 10/2001 | Hattori et al. | 438/268 |
| 2001/0036704 | A1 | 11/2001 | Hueting et al. | 438/270 |
| 2001/0053568 | A1 * | 12/2001 | Deboy et al. | 438/138 |

OTHER PUBLICATIONS

G. Deboy, et al., "A New Generation of High Voltage MOSEFs Breaks the Limit Line of Silicon", Int'l Electron Devices Meeting, Dec. 1998, 26.2.1, pp. 683-685.

Xing Bi Chen, et al., "A Novel High-Voltage Sustaining Structure With Buried Oppositely Doped Regions", *IEEE Transactions on Electron Devices*, vol. 47, No. 6, Jun. 2000, pp. 1280-1285.

N. Cezac, et al. "A New Generation of Power Unipolar Devices: The Concept of the Floating Islands MOS Transistor (FLIMOST)", Proceeding of the 12th International Symposium on Power Semiconductor Devices & ICs, Toulouse, France, May 22-25, 2000, pp. 69-72.

* cited by examiner

CONVENTIONAL MOSFET

THE DOPANT DISTRIBUTION OF A HIGH VOLTAGE VERTICAL
DMOS TRANSISTOR WITH A RELATIVELY LOW ON-RESISTANCE

1. GROW/DEPOSIT A TRENCH ETCH-STEP LAYER
2. MASK AND ETCH THE TRENCH ETCH-STEP LAYER
3. ETCH THE TRENCH

4. DEPOSIT A LAYER OF POLY THAT IS DOPED p-TYPE
5. DIFFUSE THE p-TYPE DOPANT INTO THE SINGLE CRYSTAL SILICON

6. DEPOSIT A LAYER OF POLY THAT IS DOPED n-TYPE TO FILL THE TRENCH

7. DIFFUSE THE n-TYPE AND p-TYPE DOPANT IN THE POLY LAYERS TO ELECTRICALLY COMPENSATE EACH OTHER

8. PLANARIZE THE STRUCTURE ly and the layer thickness of epitaxial layer 1. However, to increase the breakdown voltage of the device, the doping concentration of epitaxial layer 1 must be reduced while the layer thickness is increased. Curve 20 in FIG. 2 shows the on-resistance per unit area as a function of the breakdown voltage for a conventional MOSFET. Unfortunately, as curve 20 shows, the on-resistance of the device increases rapidly as its breakdown voltage increases. This rapid increase in resistance presents a problem when the MOSFET is to be operated at higher voltages, particularly at voltages greater than a few hundred volts.

HIGH VOLTAGE POWER MOSFET HAVING A VOLTAGE SUSTAINING REGION THAT INCLUDES DOPED COLUMNS FORMED BY TRENCH ETCHING AND DIFFUSION FROM REGIONS OF OPPOSITELY DOPED POLYSILICON

RELATED APPLICATIONS

This application is a divisional and claims the benefit of priority of U.S. patent application Ser. No. 10/414,949, filed Apr. 16, 2003, now U.S Pat. No. 6,794,251 and entitled "High Voltage Power MOSFET Having A Voltage Sustaining Region That Includes Doped Columns Formed By Trench Etching And Diffusion From Regions of Oppositely Doped Polysilicon," which is a divisional of U.S. patent application Ser. No. 10/039,241, filed Dec. 31, 2001, now U.S. Pat. No. 6,576,516. The disclosure of each of these prior applications is incorporated by reference herein in their entirety.

This application is also related to U.S. patent application Ser. No. 09/970,972 entitled "Method for Fabricating a Power Semiconductor Device Having a Floating Island Voltage Sustaining Layer," filed in the United States Patent and Trademark Office on Oct. 4, 2001, now U.S. Pat. No. 6,465,304, which is incorporated by reference herein in its entirety.

This application is also related to U.S. patent application Ser. No. 10/039,068 entitled "Method For Fabricating A High Voltage Power MOSFET Having A Voltage Sustaining Region That Includes Doped Columns Formed By Rapid Diffusion," filed in the United States Patent and Trademark Office on Dec. 31, 2001, now U.S. Pat. No. 6,566,201, incorporated herein by reference in their entirety.

This application is also related to U.S. patent application Ser. No. 10/038,845 entitled "High Voltage MOSFET Having A Voltage Sustaining Region That Includes Doped Columns Formed By Trench Etching And Ion Implantation," filed in the United States Patent and Trademark Office on Dec. 31, 2001, now U.S. Pat. No. 6,656,797, incorporated herein by reference in their entirety.

This application is also related to U.S. patent application Ser. No. 10/039,284 entitled "High Voltage Power MOSFET Having A Voltage Sustaining Region That Includes Doped Columns Formed By Trench Etching Using An Etchant Gas That Is Also a Doping Source," filed in the United States Patent and Trademark Office on Dec. 31, 2001, now U.S. Pat. No. 6,750,104, incorporated herein by reference in their entirety.

FIELD OF THE INVENTION

The present invention relates generally to semiconductor devices, and more particularly to power MOSFET devices.

BACKGROUND OF THE INVENTION

Power MOSFET devices are employed in applications such as automobile electrical systems, power supplies, and power management applications. Such devices should sustain high voltage in the off-state while having a low voltage drop and high current flow in the on-state.

FIG. 1 illustrates a typical structure for an N-channel power MOSFET. An N-epitaxial silicon layer 1 formed over an N+ silicon substrate 2 contains p-body regions 5a and 6a, and N+ source regions 7 and 8 for two MOSFET cells in the device. P-body regions 5 and 6 may also include deep p-body regions 5b and 6b. A source-body electrode 12 extends across certain surface portions of epitaxial layer 1 to contact the source and body regions. The N-type drain for both cells is formed by the portion of N-epitaxial layer 1 extending to the upper semiconductor surface in FIG. 1. A drain electrode is provided at the bottom of N+ substrate 2. An insulated gate electrode 18 typically of polysilicon lies primarily over the body and portions of the drain of the device, separated from the body and drain by a thin layer of dielectric, often silicon dioxide. A channel is formed between the source and drain at the surface of the body region when the appropriate positive voltage is applied to the gate with respect to the source and body electrode.

The on-resistance of the conventional MOSFET shown in FIG. 1 is determined largely by the drift zone resistance in epitaxial layer 1. The drift zone resistance is in turn determined by the doping and the layer thickness of epitaxial layer 1. However, to increase the breakdown voltage of the device, the doping concentration of epitaxial layer 1 must be reduced while the layer thickness is increased. Curve 20 in FIG. 2 shows the on-resistance per unit area as a function of the breakdown voltage for a conventional MOSFET. Unfortunately, as curve 20 shows, the on-resistance of the device increases rapidly as its breakdown voltage increases. This rapid increase in resistance presents a problem when the MOSFET is to be operated at higher voltages, particularly at voltages greater than a few hundred volts.

FIG. 3 shows a MOSFET that is designed to operate at higher voltages with a reduced on-resistance. This MOSFET is disclosed in paper No. 26.2 in the Proceedings of the IEDM, 1998, p. 683. This MOSFET is similar to the conventional MOSFET shown in FIG. 2 except that it includes p-type doped regions 40 and 42 which extend from beneath the body regions 5 and 6 into the drift region of the device. The p-type doped regions 40 and 42 define columns in the drift region that are separated by n-type doped columns, which are defined by the portions of the epitaxial layer 1 adjacent the p-doped regions 40 and 42. The alternating columns of opposite doping type cause the reverse voltage to be built up not only in the vertical direction, as in a conventional MOSFET, but in the horizontal direction as well. As a result, this device can achieve the same reverse voltage as in the conventional device with a reduced layer thickness of epitaxial layer 1 and with increased doping concentration in the drift zone. Curve 25 in FIG. 2 shows the on-resistance per unit area as a function of the breakdown voltage of the MOSFET shown in FIG. 3. Clearly, at higher operating voltages, the on-resistance of this device is substantially reduced relative to the device shown in FIG. 1, essentially increasing linearly with the breakdown voltage.

The improved operating characteristics of the device shown in FIG. 3 are based on charge compensation in the drift region of the transistor. That is, the doping in the drift region is substantially increased, e.g., by an order of magnitude or more, and the additional charge is counterbalanced by the addition of columns of opposite doping type. The blocking voltage of the transistor thus remains unaltered. The charge compensating columns do not contribute to the current conduction when the device is in its on state. These desirable properties of the transistor depend critically on the degree of charge compensation that is achieved between adjacent columns of opposite doping type. Unfortunately, nonuniformities in the dopant gradient of the columns can be difficult to avoid as a result of limitations in the control of process parameters during their fabrication. For example, diffusion across the interface between the columns and the substrate and the interface between the columns and the p-body region will give rise to changes in the dopant concentration of the portions of the columns near those interfaces.

The structure shown in FIG. 3 can be fabricated with a process sequence that includes multiple epitaxial deposition steps, each followed by the introduction of the appropriate dopant. Unfortunately, epitaxial deposition steps are expensive to perform and thus this structure is expensive to manufacture. Another technique for fabricating these devices is shown in copending U.S. application Ser. No. 09/970,972, in which a trench is successively etched to different depths. A dopant material is implanted and diffused through the bottom of the trench after each etching step to form a series of doped regions (so-called "floating islands") that collectively function like the p-type doped regions 40 and 42 seen in FIG. 3. However, the on-resistance of a device that uses the floating island technique is not as low as an identical device that uses continuous columns.

Accordingly, it would be desirable to provide a method of fabricating the MOSFET structure shown in FIG. 3 that requires a minimum number of epitaxial deposition steps so that it can be produced less expensively while also allowing sufficient control of process parameters so that a high degree of charge compensation can be achieved in adjacent columns of opposite doping type in the drift region of the device.

SUMMARY OF THE INVENTION

In accordance with the present invention, a method is provided for forming a power semiconductor device. The method begins by providing a substrate of a first or second conductivity type and then forming a voltage sustaining region on the substrate. The voltage sustaining region is formed by depositing an epitaxial layer of a first conductivity type on the substrate and forming at least one trench in the epitaxial layer. A first layer of polysilicon having a second dopant of the second conductivity type is deposited in the trench. The second dopant is diffused to form a doped epitaxial region adjacent to the trench and in the epitaxial layer. A second layer of polysilicon having a first dopant of the first conductivity type is subsequently deposited in the trench. The first and second dopants respectively located in the second and first layers of polysilicon are interdiffused to achieve electrical compensation in the first and second layers of polysilicon. Finally, at least one region of the second conductivity type is formed over the voltage sustaining region to define a junction therebetween.

The power semiconductor device formed by the inventive method may be selected from the group consisting of a vertical DMOS, V-groove DMOS, and a trench DMOS MOSFET, an IGBT, a bipolar transistor, and a diode.

In accordance with another aspect of the invention, a power semiconductor device is provided. The device includes a substrate of a first or second conductivity type and a voltage sustaining region disposed on the substrate. The voltage sustaining region includes an epitaxial layer having a first conductivity type and at least one trench located in the epitaxial layer. At least one doped column having a dopant of a second conductivity type is located in the epitaxial layer, adjacent a sidewall of the trench. A first layer of polysilicon located in the trench and a second layer of polysilicon is located over the first layer of polysilicon. The column is formed by diffusion of the second dopant from the first layer of the polysilicon into the epitaxial layer. At least one region of the second conductivity is disposed over the voltage sustaining region to define a junction therebetween.

DETAILED DESCRIPTION

In accordance with the present invention, a method of forming the p-type columns in the voltage sustaining layer of a semiconductor power device may be generally described as follows. First, one or more trenches are etched in the n-type doped epitaxial layer that is to form the voltage sustaining region of the device. Each trench is centered where a doped column is to be located. A first layer of p-type doped polysilicon is deposited in the trench. The p-type dopant in the polysilicon is diffused into the n-type doped epitaxial layer that surrounds the trench. Next, a second layer of n-type doped polysilicon is deposited to fill the trench. The dopants from the oppositely doped polysilicon layers interdiffuse, imparting electrical compensation to each other. However, the p-type doped region formed in the epitaxial layer does not undergo significant charge compensation because the diffusion rate of the n-type dopant is greater in polysilicon than in the single crystal silicon that forms the epitaxial layer. The resulting nearly electrically neutral column of polysilicon exhibits a high resistivity and does not contribute to device performance in any significant manner, while the p-type doped single crystal silicon region forms a continuous doped column with smooth sides similar to the one depicted in FIG. 3. In some embodiments of the invention the p-type dopant that is employed is boron and the n-type dopant that is employed is phosphorus, arsenic, or a combination of both.

Figure 1:
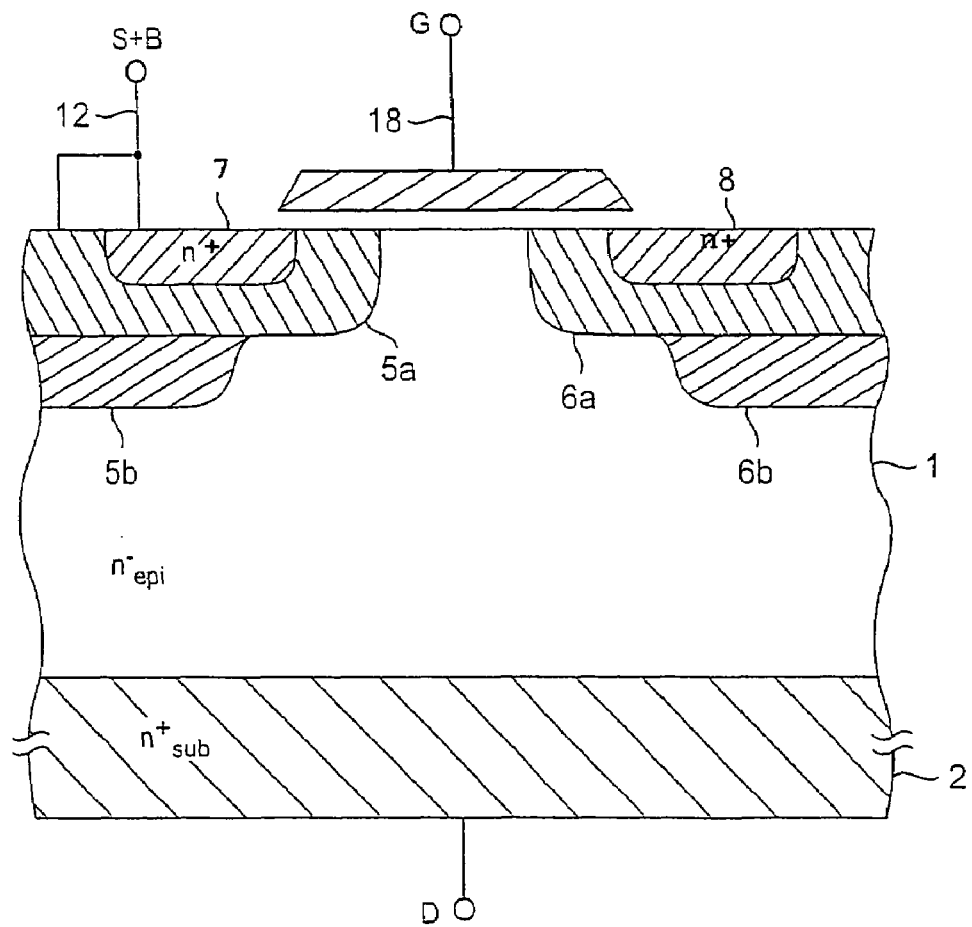
FIG. 1 shows a cross-sectional view of a conventional power MOSFET structure.
Figure 2:
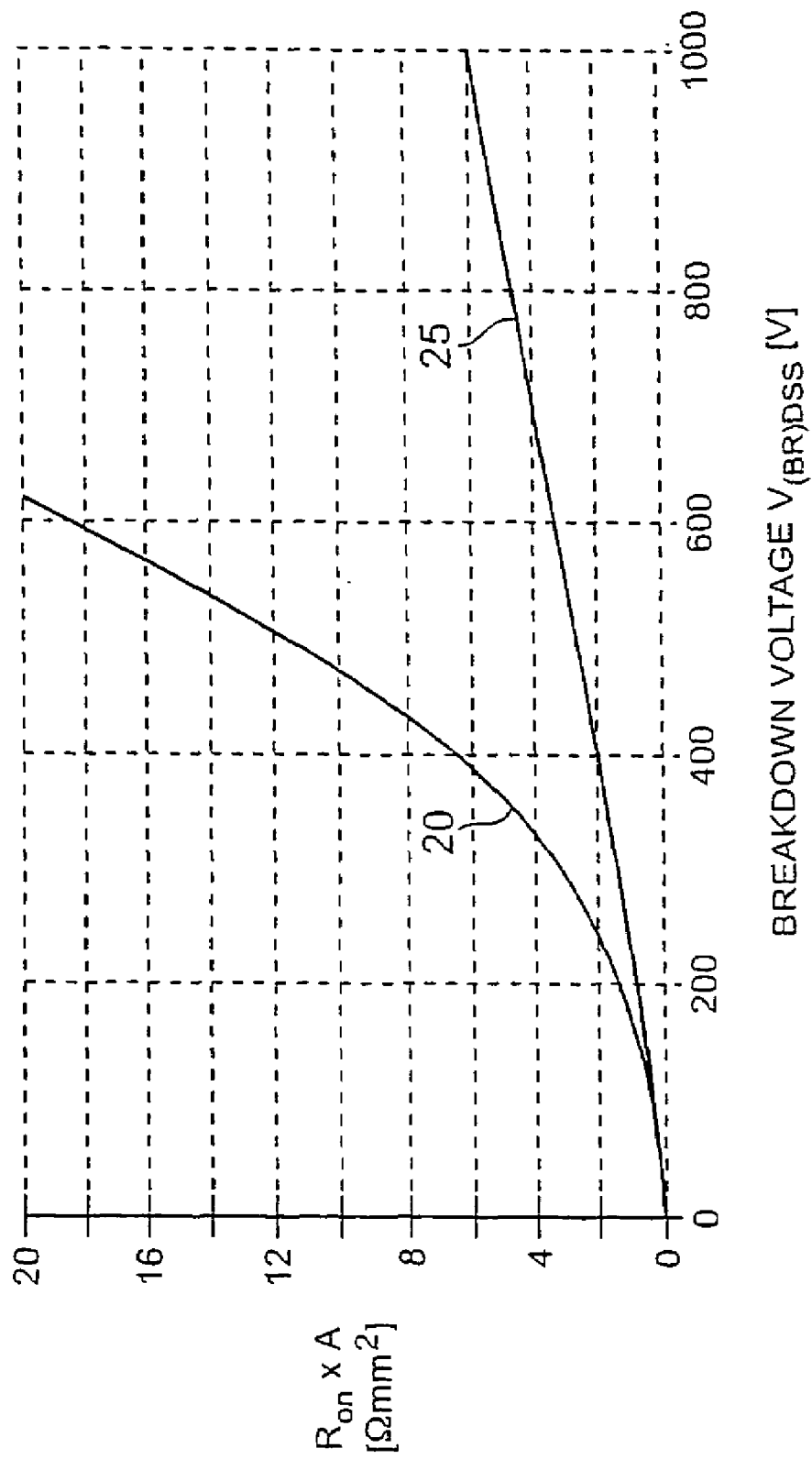
FIG. 2 shows the on-resistance per unit area as a function of the breakdown voltage for a conventional power MOSFET.
Figure 3:
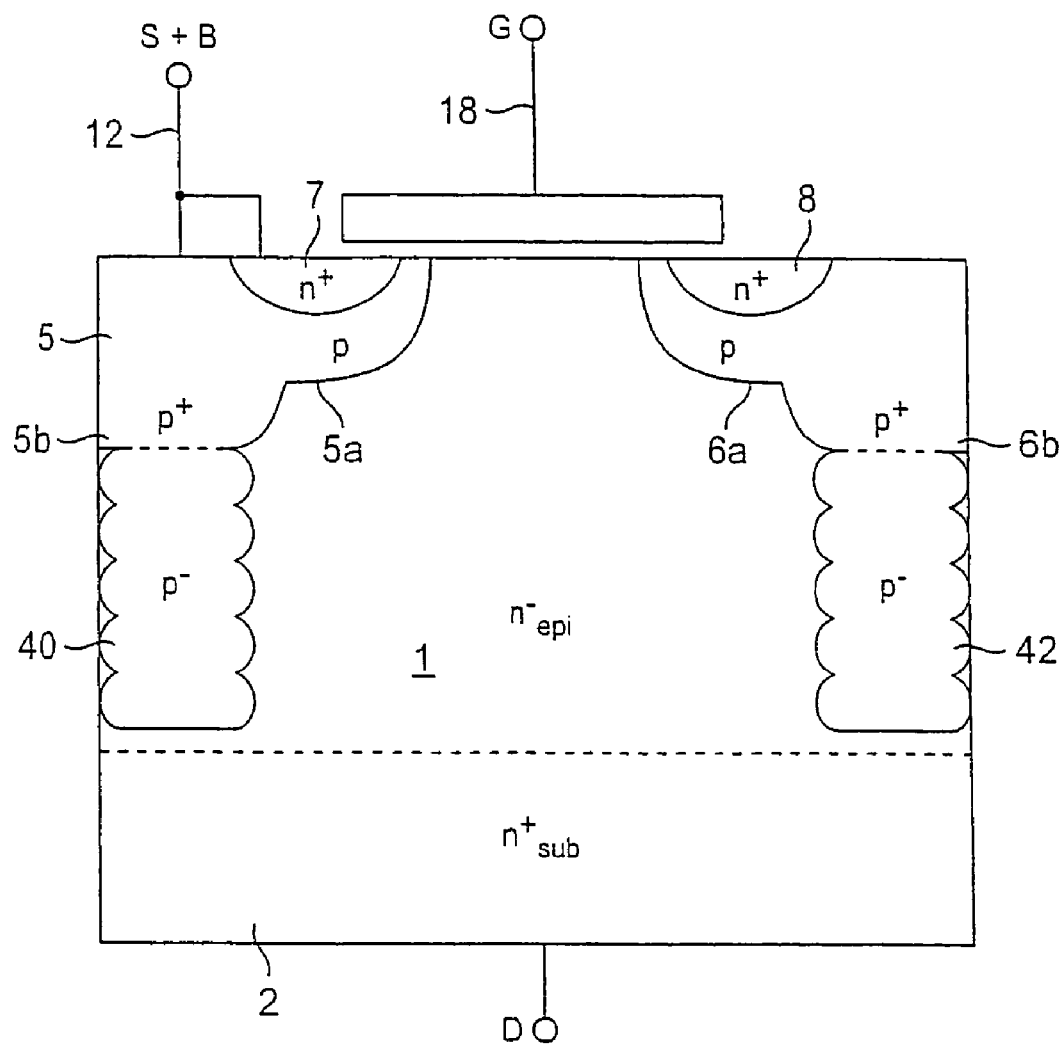
FIG. 3 shows a MOSFET structure that includes a voltage sustaining region with columns of p-type dopant located below the body region, which is designed to operate with a lower on-resistance per unit area at the same voltage than the structure depicted in FIG. 1.

A power semiconductor device similar to the one shown in FIG. 3 may be fabricated in accordance with the following exemplary steps, which are illustrated in FIGS. 4(a)-4(d).

First, the N-type doped silicon epitaxial layer 501 is grown on a conventionally N+ doped substrate 502. Epitaxial layer 501 is typically 15-50 microns in thickness for a 400-800 V device with a resistivity of 5-40 ohm-cm. Next, a dielectric masking layer is formed by covering the surface of epitaxial layer 501 with a dielectric layer, which is then conventionally exposed and patterned to leave a mask portion that defines the location of the trench 520. The trench 520 is dry etched through the mask openings by reactive ion etching to an initial depth that may range, for example, from 10-45 microns.

The sidewalls of each trench may be smoothed, if needed. First, a dry chemical etch may be used to remove a thin layer of oxide (typically about 500-1000 A) from the trench sidewalls to eliminate damage caused by the reactive ion etching process. Next, a sacrificial silicon dioxide layer is grown over the trench 520. The sacrificial layer is removed either by a buffer oxide etch or an HF etch so that the resulting trench sidewalls are as smooth as possible.

Figure 4A:
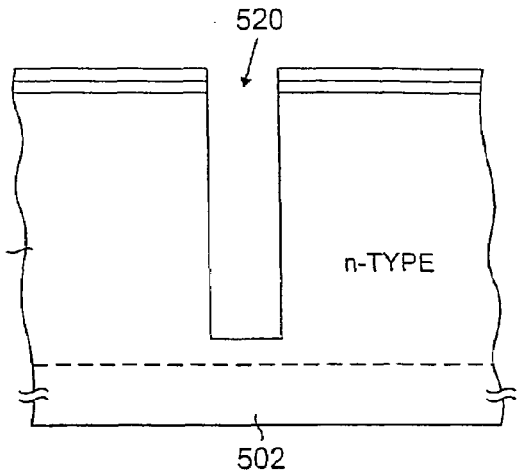
FIGS. 4(a)-4(d) show a sequence of exemplary process steps that may be employed to fabricate a voltage sustaining region constructed in accordance with the present invention.
Figure 4B:
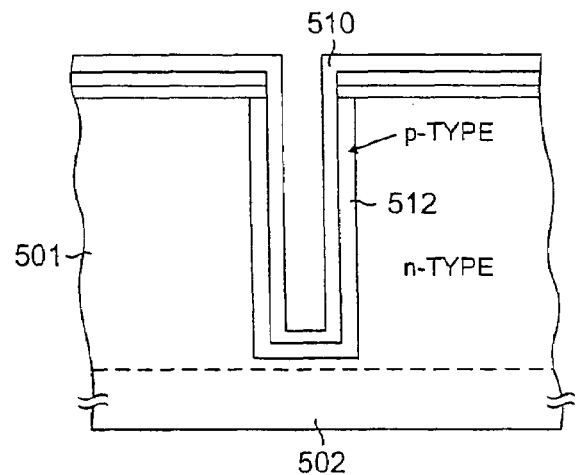

In FIG. 4(b), a layer of p-type doped polysilicon 510 is deposited in the trench 520. A diffusion step is then performed so that the p-type dopant diffuses from the trench 520 into the surrounding epitaxial layer 501, thus forming a p-type doped column 512 of single crystal silicon. In general, the trench depth, dopant dose and the magnitude and duration of the diffusion process should be selected to achieve the desired degree of charge compensation.

Figure 4C:
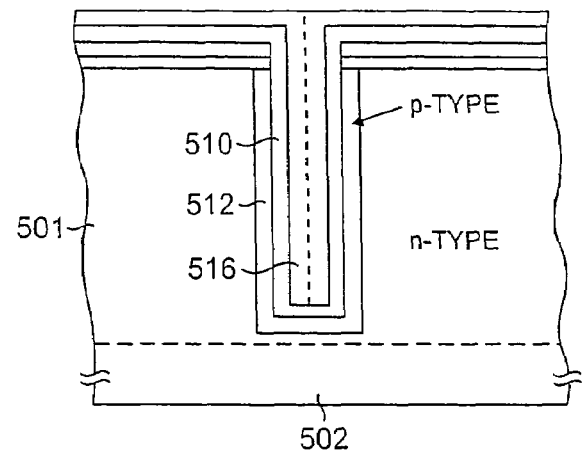

Referring to FIG. 4(c), a layer 516 of n-type doped polysilcon is then deposited to fill the trench. A diffusion step is then performed to cause the n-type dopant in polysilcon layer 516 to interdiffuse with the p-type dopant in the polysilicon layer 510. The interdiffusion process is allowed to proceed until the p- and n-type dopants electrically compensate one another so that polysilicon layers 510 and 516 are electrically neutral. The charge compensation can be achieved if the amount of n-type and p-type dopants are properly selected, as described in "On the Semi-Insulating Polcrystalline Silicon Resistor," by M. K. Lee, C. Y. Lu, K. Z. Chang and C. Shih in *Solid State Electronics*, Vol. 27, No. 11, pp. 995-1001, 1984, which is hereby incorporated by reference in its entirety.

By providing electrical compensation to the polysilicon layers located in trench 520, a high resistance region is formed within the center of the trench 520. When a reverse voltage is applied to the completed device, this resistance causes a small leakage current to flow between the two high voltage terminals of the device, assuming that any excess charge in the high resistance polysilicon region has the same conductivity type as the doped column 512 of epitaxial silicon. If, however, the high resistance polysilicon region has a conductivity type opposite to doped column 512, it will float "electrically" in the doped column 512 unless the critical electric field is exceeded.

Figure 4D:
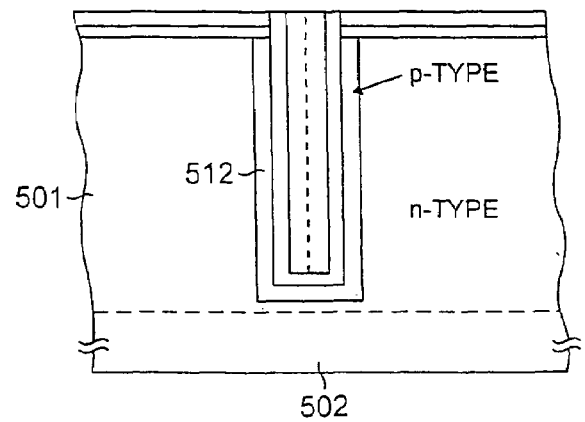

Finally, as shown in FIG. 4(d), the surface of the structure is planarized by removing the polysilicon from its surface.

The aforementioned sequence of processing steps resulting in the structure depicted in FIG. 4(d) provides a voltage sustaining layer with p-type doped columns on which any of a number of different power semiconductor devices can be fabricated. As previously mentioned, such power semiconductor devices include vertical DMOS, V-groove DMOS, and trench DMOS MOSFETs, IGBTs and other MOS-gated devices. For instance, FIG. 3 shows an example of a MOSFET that includes a voltage sustaining layer with doped columns similar to those employed in the present invention, except that in the present invention the doped columns have vertical sidewalls. It should be noted that while FIG. 4 shows a single trench that is used to form the doped column, the present invention encompasses a voltage sustaining regions having single or multiple trenches to form any number of doped columns. For example, a doped column or columns may be located below the center of the gate or in other locations when appropriate to decrease the on-resistance of the device.

Once the voltage sustaining region and the doped column or columns have been formed as shown in FIG. 4, a MOSFET similar to that shown in FIG. 3 can be completed in the following manner. The gate oxide is grown after an active region mask is formed. Next, a layer of polycrystalline silicon is deposited, doped, and oxidized. The polysilcon layer is then masked to form the gate regions. The p+ doped deep body regions 5b and 6b are formed using conventional masking, implantation and diffusion steps. For example, the p+-doped deep body regions are boron implanted at 20 to 200 KeV with a dosage from about $1 \times 10^{14}$ to $5 \times 10^{15}$/cm². The shallow body regions 5a and 6a are formed in a similar fashion. The implant dose for this region will be $1 \times 10^{13}$ to $5 \times 10^{14}$/cm² at an energy of 20 to 100 KeV.

Next, a photoresist masking process is used to form a patterned masking layer that defines source regions 7 and 8. Source regions 7 and 8 are then formed by an implantation and diffusion process. For example, the source regions may be implanted with arsenic at 20 to 100 KeV to a concentration that is typically in the range of $2 \times 10^{15}$ to $1.2 \times 10^{16}$/cm² after which an oxide layer is formed on the surface. After implantation, the arsenic is diffused to a depth of approximately 0.5 to 2.0 microns. The depth of the body region typically ranges from about 1-3 microns, with the P+ doped deep body region (if present) being slightly deeper. The DMOS transistor is completed in a conventional manner by etching the oxide layer to form contact openings on the front surface. A metallization layer is also deposited and masked to define the source-body and gate electrodes. Also, a pad mask is used to define pad contacts. Finally, a drain contact layer is formed on the bottom surface of the substrate.

It should be noted that while a specific process sequence for fabricating the power MOSFET is disclosed, other process sequences may be used while remaining within the scope of this invention. For instance, the deep p+ doped body region may be formed before the gate region is defined. It is also possible to form the deep p+ doped body region prior to forming the trenches. In some DMOS structures, the P+ doped deep body region may be shallower than the P-doped body region, or in some cases, there may not even be a P+ doped body region.

In some embodiments of the invention it is not necessary to deposit doped layers of polysilicon. Rather, dopant may be added to the first polysilicon layer 510 using gas phase doping. Alternatively, a doped layer of silicon dioxide may be deposited on the polysilicon, which is used as a solid source before it is removed in an etch step. Similarly, dopant may be added to second polysilicon layer 516 from the gas phase or from a doped deposited layer of silicon dioxide, provided the second layer doesn't fill the trench. If gas phase doping is employed, a dielectric layer or a layer of undoped polysilicon is deposited or grown to fill the trench prior to planarization. In contrast, if doped polysilicon is used as the dopant source, it can be used to fill the trench. It is also possible to deposit only one layer of doped polysilicon (e.g., layer 510) and to introduce the dopant that electrically compensates the doped polysilicon using either gas phase doping or by introducing dopant from a solid dopant source as described above. As above, the trench is subsequently filled with a dielectric or undoped polysilicon.

The previous description indicates that the n-type dopant in layer 510 does not diffuse into p-type doped column 512. However, it is in fact possible to use the n-type dopant in layer 516 to compensate some of the p-type dopant in doped column 512, thus providing a technique for adjusting the charge in doped column 512 to obtain maximum (or optimal) breakdown voltage. It is also possible to initially fill the trench with polysilcon that is undoped, then diffuse the first dopant into the polysilicon and the surrounding portion of the epitaxial layer 501 (to form doped column 512) and then diffuse the second dopant into the polysilicon to compensate the first dopant. This approach will produce a doped region that has a dopant concentration gradient that extends from the surface of the wafer to a point beyond the bottom of the trench, which gradient is a function of the trench size, the polysilicon grain size, the trench depth, the amount of dopant introduced, and other variables.

Although various embodiments are specifically illustrated and described herein, it will be appreciated that modifications and variations of the present invention are covered by the above teachings and are within the purview of the appended claims without departing from the spirit and intended scope of the invention. For example, a power semiconductor device in accordance with the present invention may be provided in which the conductivities of the various semiconductor regions are reversed from those described herein. Moreover, while a vertical DMOS transistor has been used to illustrate exemplary steps required to fabricate a device in accordance with the present invention, other DMOS FETs and other power semiconductor devices such as diodes, bipolar transistors, power JFETs, IGBTs, MCTs, and other MOS-gated power devices may also be fabricated following these teachings.

What is claimed is:

1. A power semiconductor device comprising:
    a substrate of a first or second conductivity type;
    a voltage sustaining region disposed on said substrate, said voltage sustaining region including:
        an epitaxial layer having a first conductivity type;
        at least one trench located in said epitaxial layer;
        a first layer of material located in the trench;
        a first layer of high resistivity compensated polycrystalline silicon located in the trench;
        a second layer of material located over the first layer of material containing dopant of the first conductivity type;
        at least one doped column located adjacent to the trench and in the epitaxial layer, said at least one doped column having a dopant of the second conductivity type;
    at least one region of said second conductivity disposed over said voltage sustaining region to define a junction therebetween.

2. The device of claim 1 wherein said first and second layers of material are high resistivity layers of material.

3. The device of claim 1 wherein said at least one region further includes:
    a gate dielectric and a gate conductor disposed above said gate dielectric;
    first and second body regions located in the epitaxial layer to define a drift region therebetween, said body regions having a second conductivity type; and
    first and second source regions of the first conductivity type located in the first and second body regions, respectively.

4. The device of claim 3 wherein said body regions include deep body regions.

5. The device of claim 1 wherein the second layer substantially fills the trench.

6. The device of claim 1 wherein said dopant of the second conductivity type is boron.

7. The device of claim 1 further comprising another dopant diffused from the second layer to the first layer to achieve electrical neutrality in the first layer of material.

8. The device of claim 7 wherein said another dopant includes arsenic.

9. The device of claim 7 wherein said another dopant includes phosphorus.

10. The device of claim 7 wherein said another dopant includes phosphorus and arsenic.

11. The device of claim 1 wherein said power semiconductor device is selected from the group consisting of a vertical DMOS, V-groove DMOS, and a trench DMOS MOSFET, an IGBT, a diode and a bipolar transistor.

12. The device of claim 1 wherein said first layer is polysilicon and said second layer is doped silicon dioxide.

13. The device of claim 2 wherein said first layer is polysilicon and said second layer is doped silicon dioxide.

14. The device of claim 3 wherein said first layer is polysilicon and said second layer is doped silicon dioxide.

15. The device of claim 7 wherein said first layer is polysilicon and said second layer is doped silicon dioxide.

16. A power semiconductor device comprising:
    a substrate of a first or second conductivity type;
    a voltage sustaining region disposed on said substrate, said voltage sustaining region including:
        an epitaxial layer having a first conductivity type;
        at least one trench located in said epitaxial layer, the trench filled with high resistivity, compensated polycrystalline silicon;
        at least one doped column located adjacent to the trench and in the epitaxial layer, said at least one doped column having a dopant of the second conductivity type; and
    at least one region of said second conductivity disposed over said voltage sustaining region to define a junction therebetween.

17. The device of claim 16 wherein said at least one region further includes:
    a gate dielectric and a gate conductor disposed above said gate dielectric;
    first and second body regions located in the epitaxial layer to define a drift region therebetween, said body regions having a second conductivity type; and
    first and second source regions of the first conductivity type located in the first and second body regions, respectively.

18. The device of claim 16 wherein said body regions include deep body regions.

19. The device of claim 16 wherein said dopant of the second conductivity type is boron.

20. The device of claim 16 wherein said power semiconductor device is selected from the group consisting of a vertical DMOS, V-groove DMOS, and a trench DMOS MOSFET, an IGBT, a diode and a bipolar transistor.

* * * * *

UNITED STATES PATENT AND TRADEMARK OFFICE
CERTIFICATE OF CORRECTION

PATENT NO. : 7,224,027 B2  Page 1 of 1
APPLICATION NO. : 10/945018
DATED : May 29, 2007
INVENTOR(S) : Richard A. Blanchard It is certified that error appears in the above-identified patent and that said Letters Patent is hereby corrected as shown below:

Col. 1, line 34, before "entirety", change "their" to -- its --.
Col. 1, line 41, before "entirety", change "their" to -- its --.
Col. 1, line 48, after "in", change "their" to -- its --.
Col. 2, line 7, after "18", insert -- , --.
Col. 2, line 7, after "polysilicon", insert -- , --.
Col. 3, line 8, after "perform", insert -- , --.
Col. 3, line 8, after "thus", insert -- , --.
Col. 3, line 22, after "expensively", insert -- , --.
Col. 4, line 43, after "invention", insert -- , --.
Col. 5, line 10, before "is", change "polysilcon" to -- polysilicon --.
Col. 5, lines 11 through 12, change "polysilcon" to -- polysilicon --.
Col. 5, line 51, after "sustaining", change "regions" to -- region --.
Col. 5, line 57, after "formed", insert -- , --.
Col. 5, lines 61 through 62, change "polysilcon" to -- polysilicon --.
Col. 6, line 58, before "that", change "polysilcon" to -- polysilicon --.

Signed and Sealed this

Eighteenth Day of December, 2007

JON W. DUDAS
*Director of the United States Patent and Trademark Office*